(12) United States Patent
Yang et al.

(10) Patent No.: US 9,419,596 B2
(45) Date of Patent: Aug. 16, 2016

(54) SENSE AMPLIFIER WITH IMPROVED MARGIN

(71) Applicant: Macronix International Co., Ltd., Hsinchu (TW)

(72) Inventors: Shang-Chi Yang, Xihu Township (TW); Su-Chueh Lo, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 43 days.

(21) Appl. No.: 14/479,104

(22) Filed: Sep. 5, 2014

(65) Prior Publication Data

US 2016/0072486 A1 Mar. 10, 2016

(51) Int. Cl.
| | |
|---|---|
| G05F 1/10 | (2006.01) |
| H03K 5/02 | (2006.01) |
| H01L 27/06 | (2006.01) |
| H01L 21/8234 | (2006.01) |

(52) U.S. Cl.
CPC ............ *H03K 5/023* (2013.01); *H01L 21/8234* (2013.01); *H01L 27/0617* (2013.01)

(58) Field of Classification Search
CPC ...................................................... H03K 5/023
See application file for complete search history.

(56) References Cited

U.S. PATENT DOCUMENTS

| | | | |
|---|---|---|---|
| 4,234,920 A | 11/1980 | Van Ness et al. | |
| 4,584,494 A | 4/1986 | Arakawa et al. | |
| 5,047,659 A | 9/1991 | Ullrich | |
| 5,155,379 A | 10/1992 | Narahara | |
| 5,498,987 A | 3/1996 | Nelson | |
| 6,078,168 A | 6/2000 | Paolo | |
| 7,075,353 B1 | 7/2006 | Wan et al. | |
| 7,138,841 B1 | 11/2006 | Li et al. | |
| 7,142,005 B1 | 11/2006 | Gaboury | |
| 7,459,952 B2 | 12/2008 | Ogita | |
| 7,482,759 B2 | 1/2009 | Yoneyama et al. | |
| 7,521,975 B2 | 4/2009 | Biesterfeldt et al. | |
| 7,940,549 B2 | 5/2011 | Stembridge et al. | |
| 7,961,027 B1 | 6/2011 | Chen et al. | |
| 8,060,771 B2 | 11/2011 | Tyrrell | |
| 8,314,757 B2 | 11/2012 | Osaka | |
| 8,736,331 B2 | 5/2014 | Chen | |
| 8,922,254 B2 | 12/2014 | Yang et al. | |
| 2001/0026177 A1 | 10/2001 | Iliasevitch | |
| 2005/0156836 A1 | 7/2005 | Yoneyama et al. | |
| 2007/0274138 A1 | 11/2007 | Ogiwara et al. | |
| 2008/0158760 A1 | 7/2008 | Moyer et al. | |
| 2008/0297234 A1 | 12/2008 | Moholt et al. | |
| 2008/0309383 A1 | 12/2008 | Yada et al. | |
| 2009/0009003 A1 | 1/2009 | Roth et al. | |
| 2009/0140777 A1 | 6/2009 | Morisson | |
| 2009/0224829 A1 | 9/2009 | Johansson | |
| 2009/0243708 A1 | 10/2009 | Marinca | |
| 2010/0007428 A1 | 1/2010 | Nezuka | |
| 2010/0157672 A1* | 6/2010 | Barkley .................... G11C 7/04 365/185.03 |

(Continued)

*Primary Examiner* — Daniel Puentes
(74) *Attorney, Agent, or Firm* — Haynes Beffel & Wolfeld LLP

(57) ABSTRACT

One aspect of the technology is an integrated circuit, comprising a bias circuit and a sense amplifier. The bias circuit has a diode-connected transistor and a first bias voltage. The first bias voltage is represented by a first term inversely dependent on a first mobility of charge carriers of the diode-connected transistor and inversely dependent on a first gate-to-channel dielectric capacitance of the diode-connected transistor. The sense amplifier is coupled to another transistor that has a gate coupled to the first bias voltage of the bias circuit.

19 Claims, 8 Drawing Sheets

(56) References Cited

U.S. PATENT DOCUMENTS

2010/0289548 A1 11/2010 Cheng
2011/0181256 A1 7/2011 Ulbrich et al.
2011/0181630 A1 7/2011 Smith et al.
2014/0032799 A1 1/2014 Dickson et al.
2014/0043892 A1 2/2014 Lee et al.
2014/0103965 A1 4/2014 Wang et al.
2014/0210522 A1 7/2014 Yang et al.

* cited by examiner

SENSE AMPLIFIER WITH IMPROVED MARGIN

BACKGROUND

A transistor biased in the triode region can be substituted in place of a resistor—some such embodiments are called a MOSFET resistor. Compared to an actual resistor, a transistor biased as a resistor can be smaller in area. The value of the transistor's resistance depends on the transistor fabrication and bias. However, manufacturing variations and environmental variations result in nonuniform output from current drivers and voltage sources. Such nonuniform output results in nonuniform characteristics of transistors that rely on the nonuniform current output for transistor bias and setting the resistance of the transistor. In turn, because of the nonuniform performance of the transistor being substituted for a resistor, sense amplifiers which rely on a constant resistance coupled to the sense amplifier inputs also have nonuniform results. It would be desirable to have a transistor biased as a resistor, such that its resistance is relatively independent of variations in manufacturing and environment, and such that sense amplifiers dependent on such transistors biased as resistors also have output relatively independent of variations in manufacturing and environment. An improved sense amplifier would have improved read margin, tighter threshold voltage distributions, and improved read performance.

SUMMARY

One aspect of the technology is an integrated circuit, comprising a bias circuit and a sense amplifier.

The bias circuit provides a first bias voltage. The sense amplifier has a first sense amplifier input coupled to a voltage reference through a first sense amplifier transistor. The first sense amplifier transistor has a gate coupled to a first bias voltage, such that the first sense amplifier transistor has a resistance that compensates for at least a temperature variation of the first sense amplifier transistor and a process variation of the first sense amplifier transistor. Carrier mobility refers to electron mobility for n-channel devices, and hole mobility for p-channel devices.

In one embodiment, the bias circuit has a diode-connected transistor, and the first bias voltage provided by the bias circuit is represented by a first term inversely dependent on a first mobility of charge carriers of the diode-connected transistor and inversely dependent on a first gate-to-channel dielectric capacitance of the diode-connected transistor.

In one embodiment of the technology, the first term representing the first bias voltage of the bias circuit is equal to:

a constant/(the first mobility of charge carriers*the first gate-to-channel dielectric capacitance).

In one embodiment of the technology, the first bias voltage of the bias circuit is represented by a sum of at least the first term and a second term, the second term representing a threshold voltage of the diode-connected transistor.

In various embodiments of the technology, the sense amplifier includes differential inputs including the first sense amplifier input and a second sense amplifier input. The integrated circuit comprises a pair of transistors coupled to the differential inputs. Each transistor of the pair of transistors has a gate coupled to the first bias voltage. The pair of transistors including the first sense amplifier transistor and a second sense amplifier transistor.

In some embodiments of the technology with the pair of transistors, the pair of transistors includes the first sense amplifier transistor with a first device resistance and the second sense amplifier transistor with a second device resistance. In one embodiment of the technology, the first device resistance is independent of a first mobility of charge carriers of the first sense amplifier transistor, and the second device resistance is independent of a second mobility of charge carriers of the second sense amplifier transistor. In another embodiment of the technology, the first device resistance is independent of a first gate-to-channel dielectric capacitance of the first sense amplifier transistor, and the second device resistance is independent of a second gate-to-channel dielectric capacitance of the second sense amplifier transistor.

In one embodiment of the technology, the first sense amplifier transistor is biased in a triode region.

Another aspect of the technology is an integrated circuit comprising a first circuit, a bias circuit including a first transistor connected as a diode, and a sense amplifier.

The first circuit is powered by a first supply voltage and generates a first current with a transconductance independent of variation in the first supply voltage.

The bias circuit includes a first transistor connected as a diode. The diode has a first current carrying terminal and a second current carrying terminal. A second current through the first current carrying terminal and the second current carrying terminal is based on the first current. The bias circuit provides a first bias voltage controlled by the second current.

The sense amplifier has a first sense amplifier input coupled to a second transistor. The second transistor has a gate coupled to the first bias voltage.

In one embodiment of the technology, the transconductance is inversely dependent on a series resistance in the first circuit.

In one embodiment of the technology, the first bias voltage is represented by a first term inversely dependent on a first mobility of charge carriers of the first transistor and inversely dependent on a first gate-to-channel dielectric capacitance of the first transistor. In one embodiment of the technology, the first term representing the first bias voltage of the first transistor is equal to:

a constant/(the first mobility of charge carriers*the first gate-to-channel dielectric capacitance).

In one embodiment of the technology, the first bias voltage of the first transistor is represented by a sum of at least the first term and a second term, the second term representing a threshold voltage of the first transistor.

In one embodiment of the technology, the sense amplifier includes differential inputs, and the integrated circuit further comprises a pair of transistors coupled to the differential inputs. Each transistor of the pair of transistors has a gate coupled to the first bias voltage.

In some embodiments of the technology with the pair of transistors, the pair of transistors includes a first sense amplifier transistor with a first device resistance and a second sense amplifier transistor with a second device resistance. In one embodiment of the technology, the first device resistance is independent of a first mobility of charge carriers of the first sense amplifier transistor, and the second device resistance is independent of a second mobility of charge carriers of the second sense amplifier transistor. In another embodiment of the technology, the first device resistance is independent of a first gate-to-channel dielectric capacitance of the first sense amplifier transistor, and the second device resistance is independent of a second gate-to-channel dielectric capacitance of the second sense amplifier transistor.

In one embodiment of the technology, the second transistor is biased in a triode region and acts as a resistor.

A further aspect of the technology is a manufacturing method, comprising:

providing a first circuit powered by a first supply voltage and generating a first current with a transconductance independent of variation in the first supply voltage;

providing a bias circuit including a first transistor connected as a diode, the first transistor having a first current carrying terminal and a second current carrying terminal, wherein a second current through the first current carrying terminal and the second current carrying terminal is based on the first current, the bias circuit providing a first bias voltage controlled by the second current; and providing a sense amplifier having a first sense amplifier input coupled to a second transistor, the second transistor having a gate coupled to the first bias voltage.

Various embodiment of the technology are disclosed herein.

A further aspect of the technology is a method, comprising:

generating a first bias voltage on an integrated circuit with a bias circuit having a first transistor connected as a diode, the first bias voltage represented by a first term inversely dependent on a first mobility of charge carriers of the first transistor and inversely dependent on a first gate-to-channel dielectric capacitance of the first transistor; and coupling a first input of a sense amplifier to a first sense amplifier transistor having a first gate coupled to the first bias voltage and biased in a triode region.

In one embodiment of the technology, the first term representing the first bias voltage of the bias circuit is equal to:

a constant/(the first mobility of charge carriers*the first gate-to-channel dielectric capacitance).

In one embodiment of the technology, the first bias voltage of the bias circuit is represented by a sum of at least the first term and a second term, the second term representing a threshold voltage of the first transistor.

One embodiment of the technology includes, coupling a second input of the sense amplifier to a second sense amplifier transistor having a second gate coupled to the bias voltage. The first and second inputs of the sense amplifier are differential inputs.

In some embodiments of the technology the first sense amplifier transistor has a first device resistance and the second sense amplifier transistor has a second device resistance. In one embodiment of the technology, the first device resistance is independent of a first mobility of charge carriers of the first sense amplifier transistor, and the second device resistance is independent of a second mobility of charge carriers of the second sense amplifier transistor. In another embodiment of the technology, the first device resistance is independent of a first gate-to-channel dielectric capacitance of the first sense amplifier transistor, and the second device resistance is independent of a second gate-to-channel dielectric capacitance of the second sense amplifier transistor.

DETAILED DESCRIPTION

Figure 1:
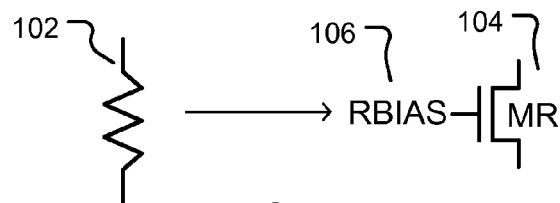
FIG. 1 is a simplified diagram showing a substitute for a resistor—a transistor biased to model a resistor.

FIG. 1 is a simplified diagram showing a substitute for a resistor—a transistor biased to model a resistor.

Resistor 102 is modeled as a transistor MR 104 receiving gate bias from RBIAS such that the transistor MR 104 is in the triode region, which has a linear dependence between voltage and current as with a resistor.

Figure 2:
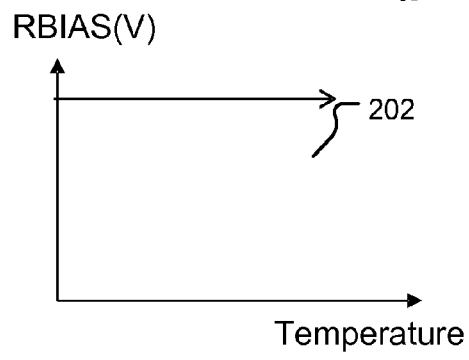
FIG. 2 is a simplified graph showing an example independence from temperature of a "constant" voltage output, such as one that would bias a transistor shown in FIG. 1.

FIG. 2 is a simplified graph showing an example independence from temperature of a "constant" voltage output, such as one that would bias a transistor shown in FIG. 1.

RBIAS is the gate bias for transistor MR in FIG. 1. The trace 202 shows temperature independence of RBIAS. A temperature independent RBIAS results in a temperature independent gate bias for transistor MR in FIG. 1, and a temperature independent resistance modeled by the transistor MR.

Figure 3:
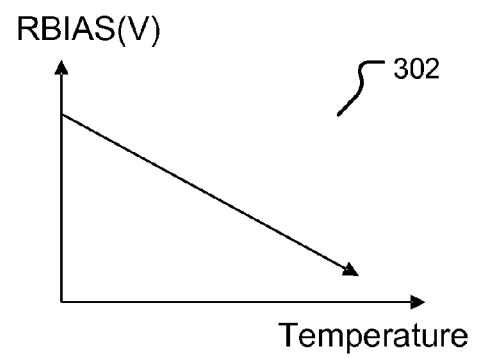
FIG. 3 is a simplified graph showing an example dependence on temperature of a "constant" voltage output, such as one that would bias a transistor shown in FIG. 1.

FIG. 3 is a simplified graph showing an example dependence on temperature of a "constant" voltage output, such as one that would bias a transistor shown in FIG. 1.

RBIAS is the gate bias for transistor MR in FIG. 1. The trace 302 shows temperature dependence of RBIAS. A temperature dependent RBIAS results in a temperature dependent gate bias for transistor MR in FIG. 1, and a temperature dependent resistance modeled by the transistor MR. Temperature "dependence" is demonstrated by increased temperature dependence in the presence of the improvement which increases temperature dependence.

Figure 4:
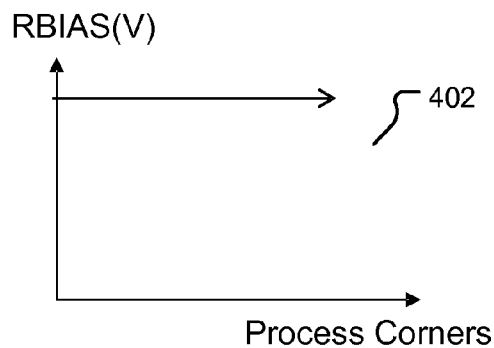
FIG. 4 is a simplified graph showing an example independence from process corner of a "constant" voltage output, such as one that would bias a transistor shown in FIG. 1.

FIG. 4 is a simplified graph showing an example independence from process corner of a nominally "constant" voltage output, such as one that would bias a transistor shown in FIG. 1.

RBIAS is the gate bias for transistor MR in FIG. 1. The trace 402 shows process corner independence of RBIAS. A process corner independent RBIAS results in a process corner independent gate bias for transistor MR in FIG. 1, and a process corner independent resistance modeled by the transistor MR.

Figure 5:
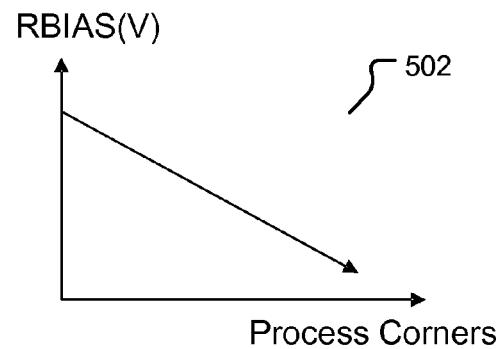
FIG. 5 is a simplified graph showing an example dependence on process corner of a "constant" voltage output, such as one that would bias a transistor shown in FIG. 1.

FIG. 5 is a simplified graph showing an example dependence on process corner of a "constant" voltage output, such as one that would bias a transistor shown in FIG. 1.

RBIAS is the gate bias for transistor MR in FIG. 1. The trace 502 shows process corner dependence of RBIAS. A process corner dependent RBIAS results in a process corner dependent gate bias for transistor MR in FIG. 1, and a process corner dependent resistance modeled by the transistor MR. Process corner "dependence" is demonstrated by increased process corner dependence in the presence of the improvement which increases process corner dependence.

Figure 6:
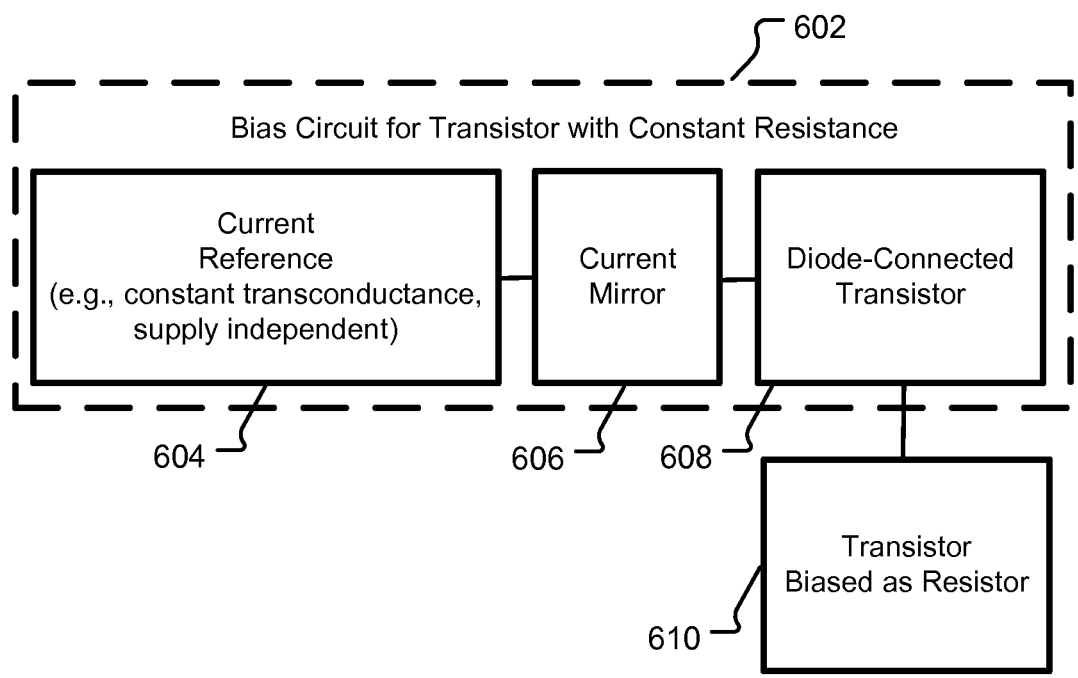
FIG. 6 is a simplified block diagram of a transistor biased to model a resistor, and bias circuitry for the transistor.

FIG. 6 is a simplified block diagram of a transistor biased to model a resistor, and bias circuitry for the transistor.

The transistor biased as a resistor 610 has a gate which is biased by bias circuit 602. The bias circuit 602 includes a current reference 604, a current mirror 606, and a diode-connected transistor 608.

Current mirrors are helpful by modifying circuit characteristics such as output resistance that is coupled to the following circuit coupled to the current mirror output. However, another embodiment omits the current mirror.

Figure 7:
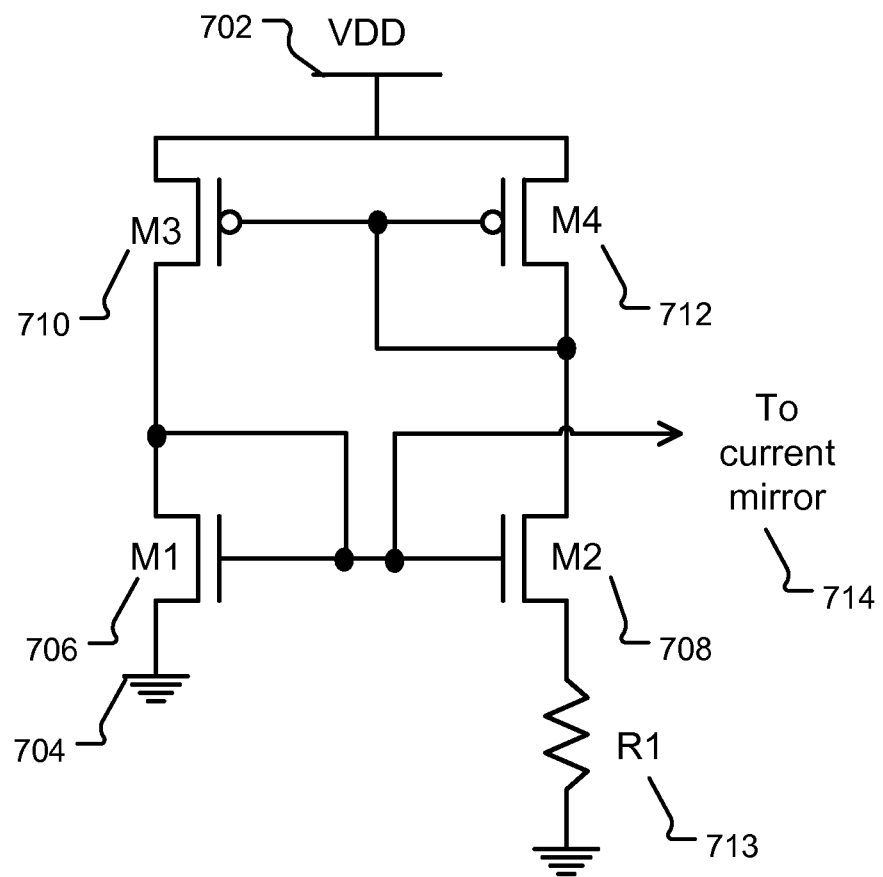
FIG. 7 is a circuit diagram of an example current reference circuit that can be used in the bias circuitry of FIG. 6.

FIG. 7 is a circuit diagram of an example current reference circuit that can be used in the bias circuitry of FIG. 6.

The shown current reference is a supply independent current reference. The voltage references are VDD 702 and ground 704. Two current paths exist between VDD 702 and ground 704, a left current path and a right current path. The left current path includes, in order from VDD 702 to ground 704, the series coupled transistors M3 710 and M1 706. The right current path includes, in order from VDD 702 to ground 704, the series coupled transistors M4 712 and M2 708, and resistor R1 713.

In the left path, p-type transistor M3 710 has a gate coupled to both the gate and the drain of p-type transistor M4 712, a source coupled to VDD 702, and a drain coupled to the drain of n-type transistor M1 706. The n-type transistor M1 706 has a source coupled to ground 704, and a gate and a drain coupled together and also coupled to the gate of n-type transistor M2 708.

In the right path, p-type transistor M4 712 has a source coupled to VDD 702, and a gate and a drain coupled together and also coupled to the drain of n-type transistor M2 708. The n-type transistor M2 708 has a gate coupled to both the gate and the drain of the n-type transistor M1 706, a drain coupled to the gate and the drain of p-type transistor M4 712, and a source coupled to the resistor R1 713. The resistor R1 713 is coupled between the source of n-type transistor M2 708 and ground 704. As shown later, the value of resistor R1 is scaled to result in the value of the resistance modeled by the transistor biased to model a resistor.

The output 714 is the transistor gate voltage of the node coupled to the gate of n-type transistor M2 708. When the output 714 from the supply independent current reference is applied to the gate of a similar transistor, the same reference current flows through the similar transistor as the reference current which flows through the n-type transistor M2 708. This resulting reference current is independent of fluctuations in VDD 702.

The reference current is:

$$Iout = \frac{2}{\mu C_{ox}(W/L)} \frac{1}{R_1^2} \left(1 - \frac{1}{\sqrt{K}}\right)^2$$

Because the goal is to show the dependence on variables, this is simplified by removing constants to:

$$Iout \approx \frac{1}{\mu C_{ox}(W/L)} \frac{1}{R_1^2}$$

Other embodiments are other constant transconductance current references.

Figure 8:
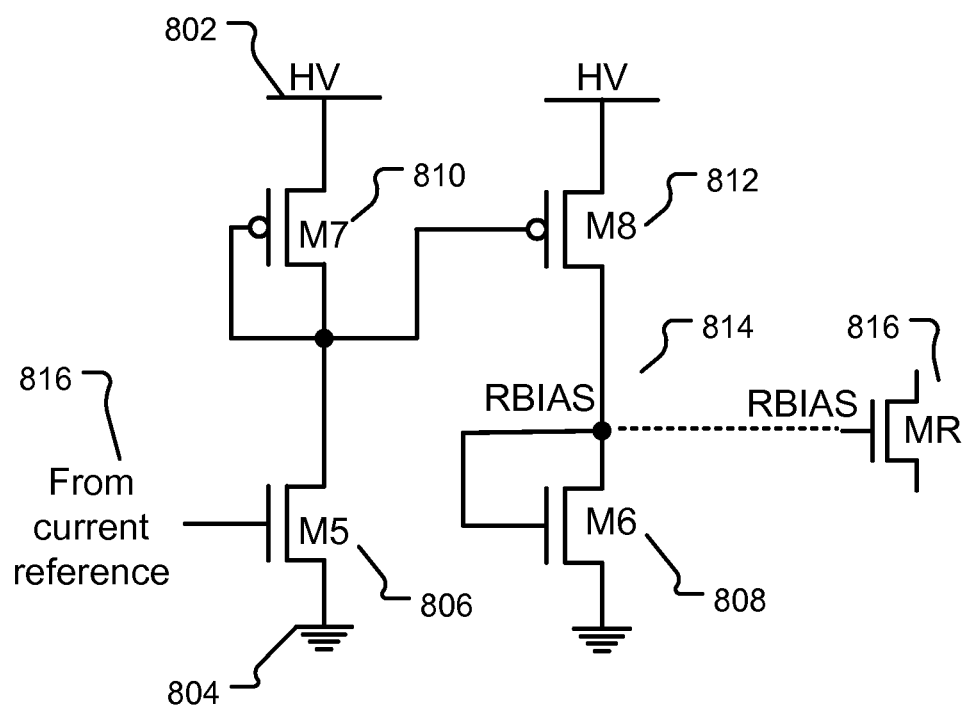
FIG. 8 is a circuit diagram of an example current mirror circuit and diode-connected transistor that can be used in the bias circuitry of FIG. 6.

FIG. 8 is a circuit diagram of an example current mirror circuit and diode-connected transistor that can be used in the bias circuitry of FIG. 6. Current mirrors are helpful by modifying circuit characteristics such as output resistance that is coupled to the following circuit coupled to the current mirror output.

In the example current mirror circuit, the current flowing through the left current path is mirrored to the right current path. The voltage references are HV 802 and ground 804. The HV 802 voltage reference is larger than VDD, resulting in increased RBIAS value. Another embodiment does not use HV 802, at the cost of lowered RBIAS value. Two current paths exist between HV 802 and ground 804, a left current path and a right current path.

The left current path includes, in order from HV 802 to ground 804, the series coupled transistors M7 810 and M5 806. The right current path includes, in order from HV 802 to ground 804, the series coupled transistors M8 812 and M6 808.

In the left path, p-type transistor M7 810 has a source coupled to HV 802, and a gate and a drain coupled together and to the gate of p-type transistor M8 812. The n-type transistor M5 806 has a source coupled to ground 804, a gate coupled to the current reference output 816 such as from FIG. 6 or 7, and a drain coupled to both the gate and the drain of p-type transistor M7 810.

In the right path, p-type transistor M8 812 has a source coupled to HV 802, a gate coupled to both the gate and the drain of p-type transistor M7 810, and a drain coupled to both the gate and the drain of n-type transistor M6 808. The n-type transistor M6 808 has a source coupled to ground 804, and a gate and a drain coupled together and to the drain of p-type transistor M8 812.

Responsive to the current reference output 816, the current from the current reference circuit is generated in the left current path. The current in the left current path is mirrored to the right current path.

The output 814 RBIAS is the transistor gate voltage of the node coupled to the gate and the drain of n-type transistor M6 808. The output 814 RBIAS is applied to the gate of a transistor that models a resistor, such as transistor MR 816.

The output voltage RBIAS of the diode-connected transistor M6 808 is:

$$RBIAS = \left(\sqrt{\frac{2I_{out}}{\mu_n C_{ox} \frac{W}{L}}} + V_{th}\right)$$

Because the goal is to show dependence of variables, this is simplified by removing constants to:

$$RBIAS = \left( \sqrt{\frac{I_{out}}{\mu_n C_{ox} \frac{W}{L}}} + V_{th} \right)$$

Substitution of the reference current formula into RBIAS formula results in a simplified version for RBIAS:

$$RBIAS = \frac{1}{\mu_n C_{ox} R_1} + V_{th}$$

Next the RBIAS formula is used in a formula for on resistance, Ron, which is derived from the transistor current formula:

$$R_{on} = \frac{V_{on}}{I_{on}}$$
$$= \frac{1}{\mu_n C_{ox} \frac{W}{L} (RBIAS - V_{th})}$$
$$= \frac{1}{\mu_n C_{ox} \frac{W}{L} \left( \frac{1}{\mu_n C_{ox} R_1} \right)}$$
$$= \frac{R_1 L}{W}$$

According to the preceding result, the resistance value of the transistor biased as a resistor is adjustable by varying the (W/L) ratio of transistor width to length, and by varying the value of R1 713 in FIG. 7. Also according to the preceding result, Ron is independent of temperature, mobility, and oxide thickness (an example of process variation), thereby compensating for variations in temperature, mobility, and oxide thickness.

The preceding result is distinctive, because a typical expression for transistor drain current is more complicated, including dependencies such as carrier mobility and gate-to-channel dielectric capacitance:

$$I_D = \frac{\mu C_{ox}}{2} \frac{W}{L} [2(V_{GS} - V_{th})V_{DS} - V_{DS}^2]$$

Figure 9:
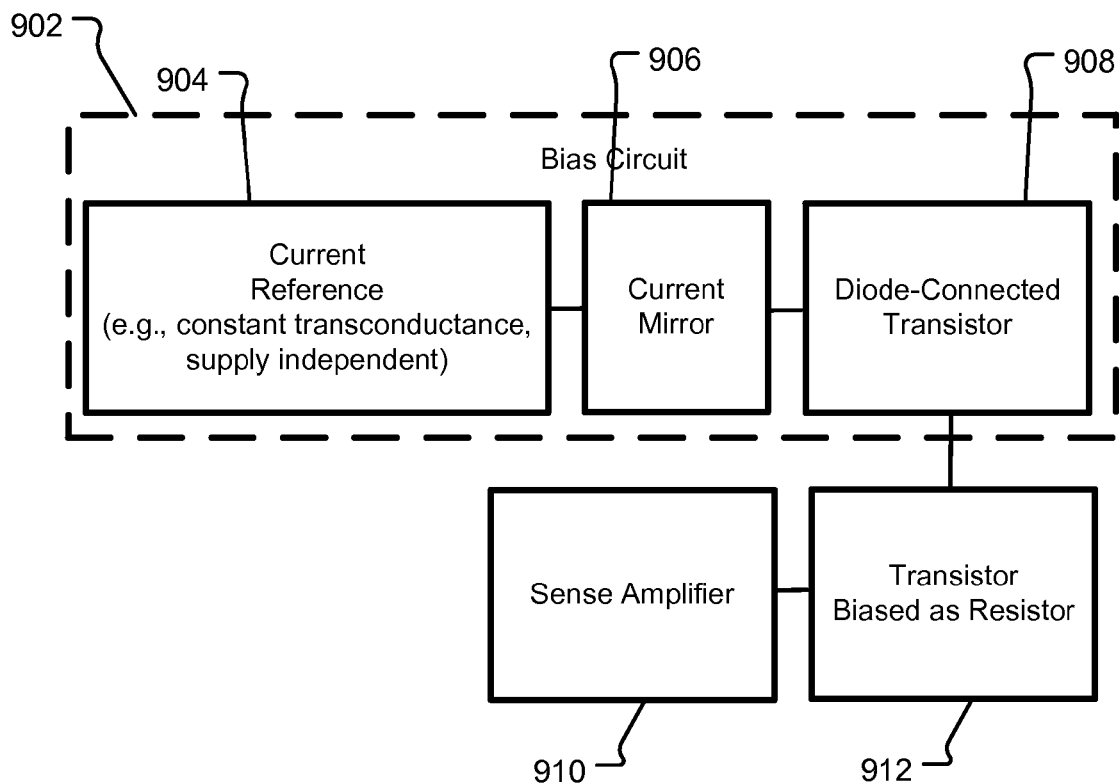
FIG. 9 is a simplified block diagram of a transistor biased to model a resistor, and bias circuitry for the transistor.

FIG. 9 is a simplified block diagram of a transistor biased to model a resistor, and bias circuitry for the transistor.

The block diagram of FIG. 9 is similar to FIG. 6. However, a sense amplifier is also included.

A sense amplifier 910 is coupled to a transistor biased as a resistor 912. The transistor biased as a resistor 912 has a gate which is biased by bias circuit 902. The bias circuit 902 includes a current reference 904, a current mirror 906, and a diode-connected transistor 908.

Current mirrors are helpful by modifying circuit characteristics such as output resistance. Another embodiment omits the current mirror.

Figure 10:
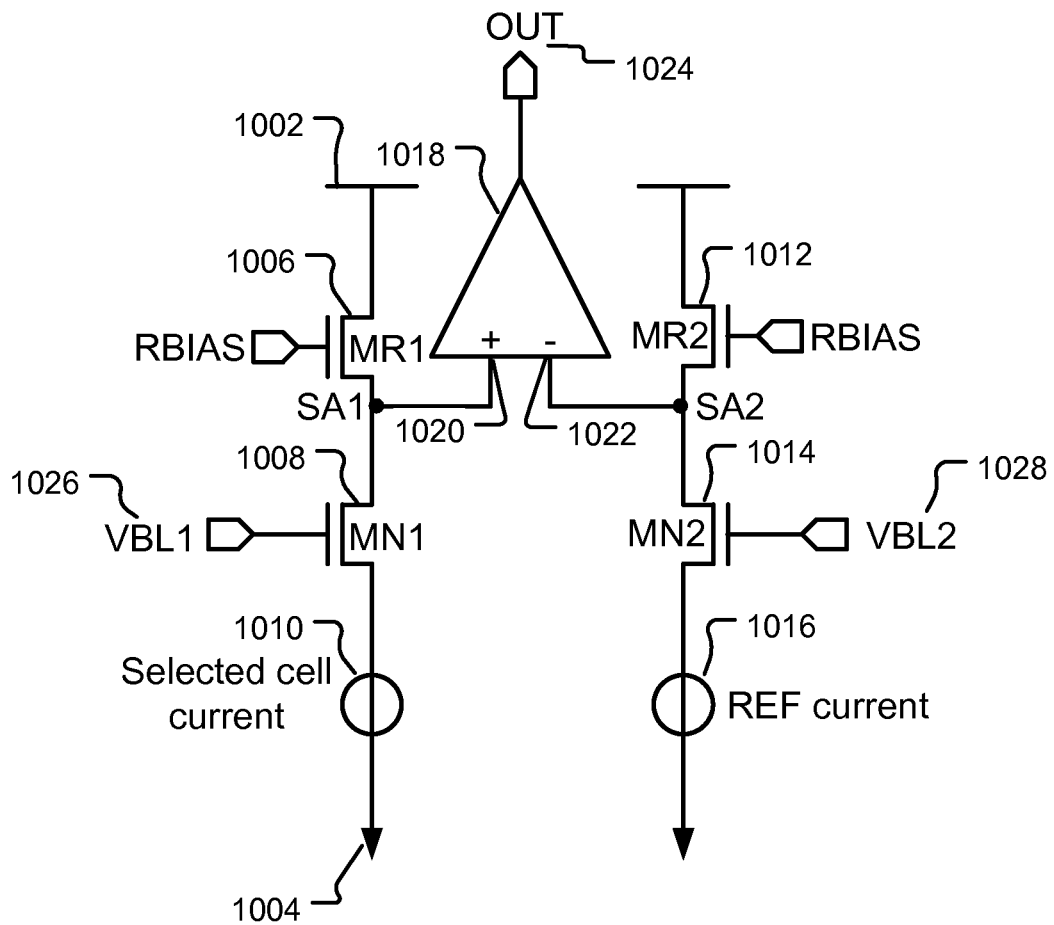
FIG. 10 is a simplified block diagram of a sense amplifier coupled to a transistor biased to model a resistor.

FIG. 10 is a simplified block diagram of a sense amplifier coupled to a transistor biased to model a resistor.

Sense amplifier 1018 includes an output 1024 and differential inputs +1020 and −1022. The differential + input 1020 is coupled to the selected cell in the left current branch. The differential − input 1022 is coupled to a reference current in the right current branch.

The left current branch includes, in series, the high voltage reference 1002, the transistor MR1 1006 which models a resistor, and transistor MN1 1008. In the left current branch, the selected cell current 1010 flows, which depends on the data value stored in a memory cell selected for a read operation. Node SA1 in between transistor MR1 1006 and transistor MN1 1008 is coupled to the differential + input 1020.

The right current branch includes, in series, the high voltage reference 1002, the transistor MR2 1012 which models a resistor, and transistor MN2 1014. In the right current branch, the reference cell current 1016 flows, which depends on the data value stored in a reference memory cell. Node SA2 in between transistor MR2 1012 and transistor MN2 1014 is coupled to the differential−input 1022.

Other embodiments are directed to sense amplifiers other than clamped bit line sense amplifiers, such as voltage sense amplifiers, offset-compensated sense amplifiers, and non-strobed regenerative sense amplifiers.

The read margin of the sense amplifier is equal to delta I*Ron. A uniform Ron across temperature and process conditions results in a uniform read margin across temperature and process conditions. However, if Ron varies with temperature and/or, process corner, then the value of Ron decreases, resulting in decreased read margin. A smaller read margin more readily results in read failure, for example due to device mismatch and power noise.

Figure 11:
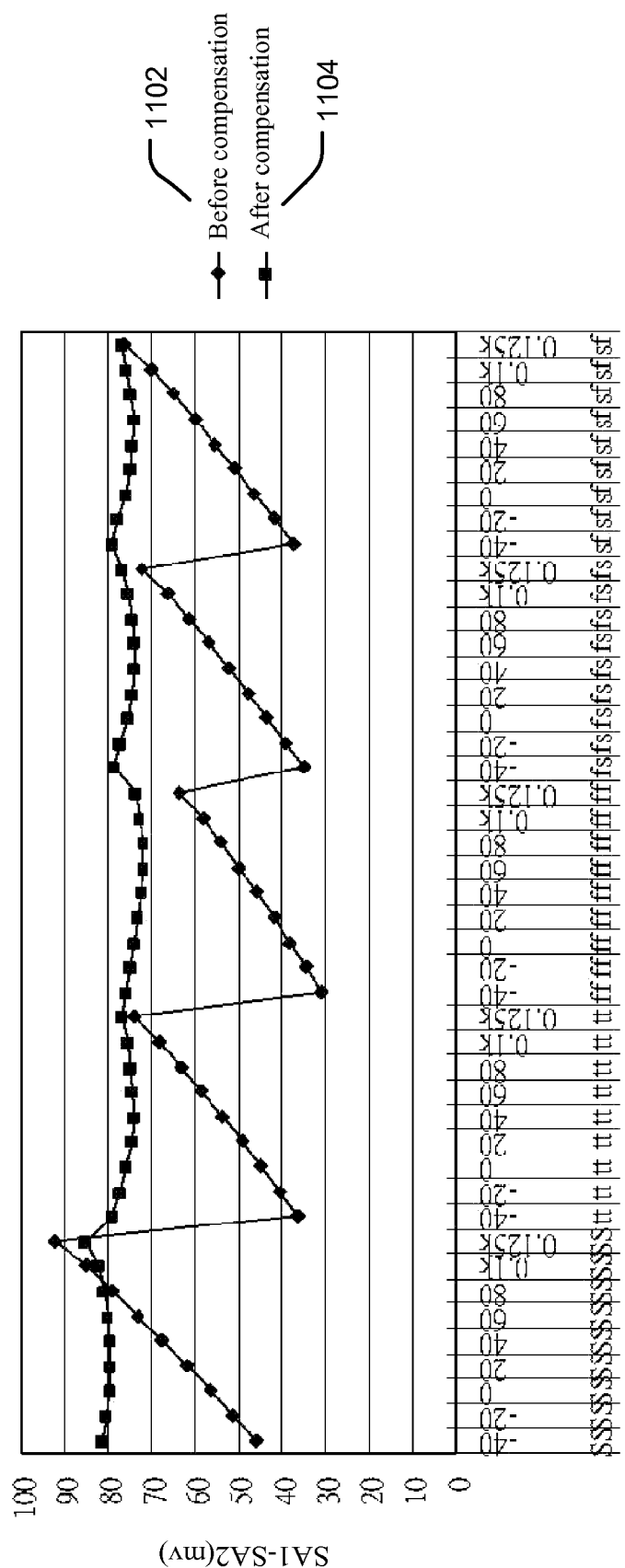
FIG. 11 is a graph contrasting the temperature independence and process corner independence of a sense amplifier coupled to a transistor biased to model a resistor, with the temperature dependence and process corner dependence of another sense amplifier without such a transistor.

FIG. 11 is a graph contrasting the temperature independence and process corner independence of a sense amplifier coupled to a transistor biased to model a resistor, with the temperature dependence and process corner dependence of another sense amplifier without such a transistor.

The y-axis indicates SA1-SA2 which equals read margin. A larger read margin means that memory data are more easily read out.

The sense amplifier which is not coupled to a transistor biased to model a resistor has a trace 1102 which has great change over different process corners and different temperatures. The sense amplifier coupled to a transistor biased to model a resistor has a trace 1104 which has less change over different process corners and different temperatures.

Other embodiments are directed to sense amplifiers other than clamped bit line sense amplifiers, such as voltage sense amplifiers, offset-compensated sense amplifiers, and non-strobed regenerative sense amplifiers.

The following temperatures are shown: −24 degrees Celsius, −20 degrees Celsius, 0 degrees Celsius, 20 degrees Celsius, 40 degrees Celsius, 60 degrees Celsius, 80 degrees Celsius.

The following process corners are shown:
SS (slow-slow): NMOS with small driving current; PMOS with small driving current.
TT (typical-typical): NMOS with normal driving current; PMOS with normal driving current.
FF (fast-fast): NMOS with large driving current; PMOS with large driving current.
SF (slow-fast): NMOS with small driving current; PMOS with large driving current.
FS (fast-slow): NMOS with large driving current; PMOS with small driving current.

Small means 20% lower than the normal case. Large means 20% larger than the normal case.

Figure 12:
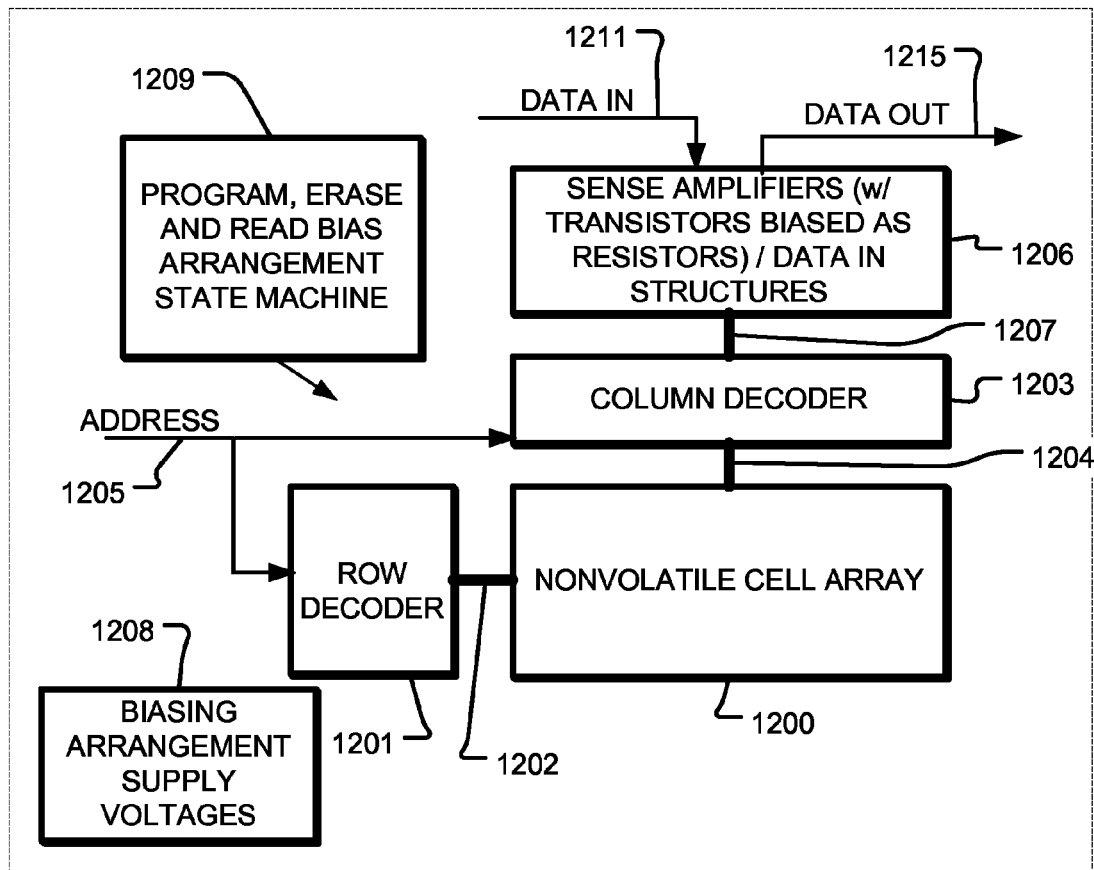
FIG. 12 is a simplified block diagram of an example integrated circuit with a sense amplifier coupled to a transistor biased to behave as a resistor.

FIG. 12 is a simplified block diagram of an example integrated circuit with a sense amplifier coupled to a transistor biased to model a resistor.

An integrated circuit 1250 includes a memory array 1200. A word line decoder and word line drivers 1201 is coupled to, and in electrical communication with, a plurality of word lines 1202, and arranged along rows in the memory array 1200. A bit line decoder and drivers 1203 are coupled to and in electrical communication with a plurality of bit lines 1204 arranged along columns in the memory array 1200 for reading data from, and writing data to, the memory cells in the memory array 1200. Addresses are supplied on bus 1205 to the word line decoder and drivers 1201 and to the bit line decoder 1203. Sense amplifiers which are coupled to transistors bias as resistors as disclosed herein, and data-in structures in block 1206, are coupled to the bit line decoder 1203 via the bus 1207. Data is supplied via the data-in line 1211 from input/output ports on the integrated circuit 1250, to the data-in structures in block 1206. Data is supplied via the data-out line 1215 from the sense amplifiers in block 1206 to input/output ports on the integrated circuit 1250, or to other data destinations internal or external to the integrated circuit 1250. Program, erase, and read bias arrangement state machine circuitry 1209 controls read latency, controls the timeout timer between consecutive read operations, and determines the components of read latency.

Figure 13:
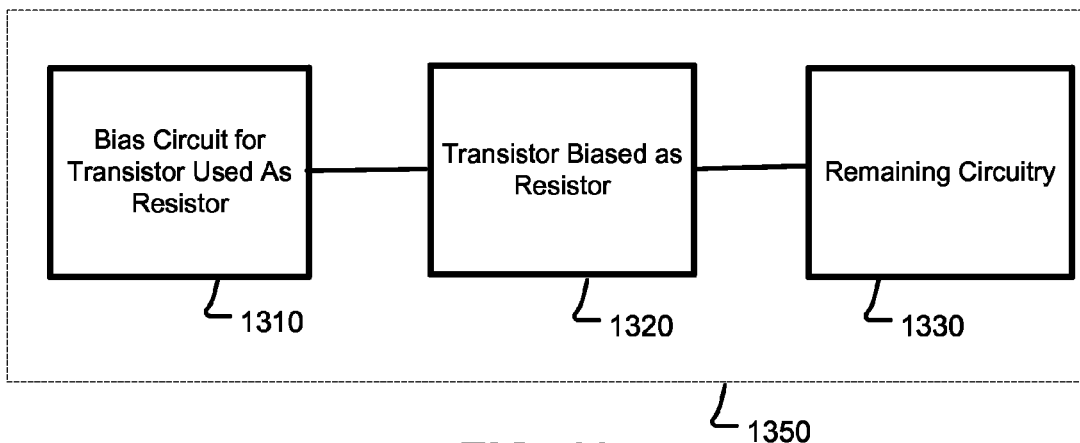
FIG. 13 is a simplified block diagram of an example integrated circuit with a transistor biased to model a resistor.

FIG. 13 is a simplified block diagram of an example integrated circuit with a transistor biased to model a resistor.

An integrated circuit 1350 includes a bias circuit 1310 for one or more transistors biased as a resistor 1320, which is sued with other remaining circuitry 1330.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. An integrated circuit, comprising:
a memory cell to store data;
a sense amplifier having a first sense amplifier input on a current branch having cell current from the memory cell;
a first transistor coupling the first sense amplifier input to a voltage reference, the first transistor having a gate coupled to a first compensation voltage, the first compensation voltage biasing the first transistor to have a resistance that compensates for at least a temperature variation of the first transistor and a process variation of the first transistor, wherein the memory cell to store data and the first transistor are different transistors; and
a bias circuit providing the first compensation voltage.

2. The integrated circuit of claim 1, wherein the bias circuit has a diode-connected transistor, and the first compensation voltage provided by the bias circuit has a first voltage component that is inversely dependent on a first mobility of charge carriers of the diode-connected transistor and inversely dependent on a first gate-to-channel dielectric capacitance of the diode-connected transistor.

3. The integrated circuit of claim 2, wherein the bias circuit includes a resistor (R1) having a resistance value, and said resistance of the first transistor based on said resistance value.

4. The integrated circuit of claim 2, wherein the first compensation voltage of the bias circuit is a sum of at least the first voltage component and a second voltage component, the second voltage component including a threshold voltage of the diode-connected transistor.

5. The integrated circuit of claim 1, wherein the sense amplifier includes differential inputs including the first sense amplifier input and a second sense amplifier input, and the integrated circuit comprises:
a pair of transistors coupled to the differential inputs, each transistor of the pair of transistors having a gate coupled to the first compensation voltage, the pair of transistors including the first transistor and a second transistor.

6. The integrated circuit of claim 5, wherein the pair of transistors includes the first transistor with a first device resistance and the second transistor with a second device resistance, the first device resistance independent of a first mobility of charge carriers of the first transistor, and the second device resistance independent of a second mobility of charge carriers of the second transistor.

7. The integrated circuit of claim 5, wherein the pair of transistors includes a first transistor with a first device resistance and the second transistor with a second device resistance, the first device resistance independent of a first gate-to-channel dielectric capacitance of the first transistor, and the second device resistance independent of a second gate-to-channel dielectric capacitance of the second transistor.

8. The integrated circuit of claim 1, including a second transistor in the current branch between the memory cell and the first sense amplifier input.

9. An integrated circuit, comprising:
a first circuit powered by a first supply voltage and generating a first current with a transconductance independent of variation in the first supply voltage;
a bias circuit including a first transistor connected as a diode, the first transistor having a first current carrying terminal and a second current carrying terminal, wherein a second current through the first current carrying terminal and the second current carrying terminal is based on the first current, the bias circuit providing a first compensation voltage controlled by the second current; and
a second transistor having a gate coupled to the first compensation voltage;
a sense amplifier having a first sense amplifier input coupled to the second transistor;
a cell having a data value that determines a cell current, the cell different from the second transistor; and
a current branch coupled to the first sense amplifier input and coupled to the cell to support the cell current flowing in the current branch and the second transistor.

10. The integrated circuit of claim 9, wherein the transconductance is inversely dependent on a series resistance in the first circuit.

11. The integrated circuit of claim 9, wherein the first compensation voltage has a first voltage component that is inversely dependent on a first mobility of charge carriers of the first transistor and inversely dependent on a first gate-to-channel dielectric capacitance of the first transistor.

12. The integrated circuit of claim 11, wherein the bias circuit includes a resistor (R1) having a resistance value, and said resistance of the first transistor is based on said resistance value.

13. The integrated circuit of claim 11, wherein the first compensation voltage of the first transistor is a sum of at least the first voltage component and a second voltage component, the second voltage component including a threshold voltage of the first transistor.

14. The integrated circuit of claim 9, wherein the sense amplifier includes differential inputs, and the integrated circuit further comprises:

a pair of transistors coupled to the differential inputs, each transistor of the pair of transistors having a gate coupled to the first compensation voltage.

15. The integrated circuit of claim 14, wherein the pair of transistors includes a first transistor with a first device resistance and a second transistor with a second device resistance, the first device resistance independent of a first mobility of charge carriers of the first transistor, and the second device resistance independent of a second mobility of charge carriers of the second transistor.

16. The integrated circuit of claim 14, wherein the pair of transistors includes a first transistor with a first device resistance and a second transistor with a second device resistance, the first device resistance independent of a first gate-to-channel dielectric capacitance of the first transistor, and the second device resistance independent of a second gate-to-channel dielectric capacitance of the second transistor.

17. A method of manufacturing an integrated circuit, comprising:
providing a first circuit powered by a first supply voltage and generating a first current with a transconductance independent of variation in the first supply voltage;
providing a bias circuit including a first transistor connected as a diode, the first transistor having a first current carrying terminal and a second current carrying terminal, wherein a second current through the first current carrying terminal and the second current carrying terminal is based on the first current, the bias circuit providing a first compensation voltage controlled by the second current; and
providing a second transistor having a gate coupled to the first compensation voltage;
providing a sense amplifier having a first sense amplifier input coupled to a second transistor;
providing a cell having a data value that determines a cell current, the cell different from the second transistor; and
providing a current branch coupled to the first sense amplifier input, and coupled to the cell to support the cell current flowing in the current branch and the second transistor.

18. The method of claim 17, wherein the transconductance is inversely dependent on a series resistance in the first circuit.

19. The method of claim 17, wherein the sense amplifier includes differential inputs, and the method further comprises:
providing a pair of transistors coupled to the differential inputs, each transistor of the pair of transistors having a gate coupled to the first compensation voltage.

* * * * *